United States Patent
Peters et al.

(10) Patent No.: US 6,465,811 B1
(45) Date of Patent: Oct. 15, 2002

(54) LOW-CAPACITANCE BOND PADS FOR HIGH SPEED DEVICES

(75) Inventors: Frank Peters, Lompoc, CA (US); Jonathan Geske, Lompoc, CA (US)

(73) Assignee: Gore Enterprise Holdings, Inc., Newark, DE (US)

( * ) Notice: Subject to any disclaimer, the term of this patent is extended or adjusted under 35 U.S.C. 154(b) by 0 days.

(21) Appl. No.: 09/351,702

(22) Filed: Jul. 12, 1999

(51) Int. Cl.$^7$ ............................................... H01L 23/48
(52) U.S. Cl. ........................................ 257/99; 257/773
(58) Field of Search .................... 257/773, 758, 257/774, 775, 776, 728, 99, 88, 93, 91, 625, 507, 81, 276; 372/45, 46, 47

(56) References Cited

U.S. PATENT DOCUMENTS

| | | | |
|---|---|---|---|
| 4,309,670 A | | 1/1982 | Burnham et al. ....... 331/94.5 H |
| 5,115,442 A | | 5/1992 | Lee et al. ...................... 372/45 |
| 5,219,713 A | | 6/1993 | Robinson ..................... 430/314 |
| 5,243,200 A | * | 9/1993 | Kawasaki et al. ............. 257/99 |
| 5,295,147 A | | 3/1994 | Jewell et al. .................. 372/45 |
| 5,308,440 A | | 5/1994 | Chino et al. ................. 156/664 |
| 5,327,448 A | | 7/1994 | Holonyak, Jr. et al. ....... 372/94 |
| 5,331,654 A | | 7/1994 | Jewell et al. .................. 372/45 |
| 5,403,775 A | | 4/1995 | Holonyak, Jr. et al. ..... 437/129 |
| 5,404,025 A | * | 4/1995 | Yamada ....................... 257/507 |
| 5,536,971 A | * | 7/1996 | Oishi et al. .................. 257/776 |
| 5,567,982 A | * | 10/1996 | Bartelink ..................... 257/664 |
| 5,686,743 A | * | 11/1997 | Lammert ..................... 257/276 |
| 5,699,375 A | | 12/1997 | Paoli ........................... 372/50 |
| 5,754,578 A | | 5/1998 | Jayaraman ................... 372/50 |
| 5,789,817 A | * | 8/1998 | Richards et al. ............. 257/724 |
| 5,897,329 A | | 4/1999 | Jewell ......................... 438/38 |
| 5,903,589 A | | 5/1999 | Jewell ......................... 372/46 |
| 5,915,168 A | | 6/1999 | Salatino et al. ............. 438/110 |

FOREIGN PATENT DOCUMENTS

| | | |
|---|---|---|
| EP | 0 809288 | 11/1997 |
| GB | 2211986 | 7/1989 |

* cited by examiner

*Primary Examiner*—Kamand Cuneo
*Assistant Examiner*—Lourdes Cruz
(74) *Attorney, Agent, or Firm*—Victor M. Genco; Eric J. Sheets (57) ABSTRACT

In a vertical cavity surface emitting laser (VCSEL), the metal contact area, the associated metal bonding pad and the interconnecting metal bridge are deposited on top of a conductive upper mirror stack. To prevent current flow from the pad through the conductive mirror stack which would bypass the active medium, a moat is etched surrounding the pad area. The moat isolates the pad area and the conductive material beneath the pad area. In a method of making a VCSEL, the semiconductor layered portion of an optical semiconductor device is first formed on a suitable substrate. Such semiconductor layers can include various layers of conductive, semiconductive or insulating material as may be required for the type of device being constructed. The metal contact and the metal bonding pad areas together with an interconnecting metal bridge are then deposited on the surface of the semiconductor layers. The structure is then etched down from the top surface to form a moat surrounding the bonding pad area which electrically isolates the semiconductor layered material beneath the bonding pad. An alternative method of making a VCSEL is to form the semiconductor layers and then etch the areas surrounding the bonding pad from the bottom upwardly toward the metal bonding pad. According to this method the etch need only go high enough to prevent the current flow bypassing the active medium of the optical semiconductor device. Once the moat has been formed, the structure is completed by securing it to a suitable substrate.

7 Claims, 7 Drawing Sheets

LOW-CAPACITANCE BOND PADS FOR HIGH SPEED DEVICES

BACKGROUND OF THE INVENTION

1. Field of the Invention

This patent relates to fabrication of low-capacitance bonding pads for high-speed optical semiconductor devices such as lasers, detectors, and modulators.

2. Description of the Related Art

For many high-speed optical semiconductor devices, such as lasers, detectors and modulators, pad capacitance is often the greatest inhibitor to achieving higher data rates of operation. The pad capacitance has previously been removed, or largely eliminated, from high-speed devices using a number of techniques.

One such technique uses an air-bridge to connect a deposited top-level contact metal to a pad level metal when the pad metal is on a semi-insulating layer. One way of making suitable air-bridges is described in U.S. Pat. No. 5,219,713 issued Jun. 15, 1993 entitled "Multi-Layer Photoresist Air Bridge Fabrication Method".

According to another technique, contact metal is deposited on a thick polyamide insulating layer. Because the polyamide is non-planar, special metal deposition techniques and often electroplating are required to build up the necessary thickness of the metal.

Although both techniques are useful, they are somewhat complicated, difficult to achieve in high yield, and may provide poor adhesion for subsequent wire or flip-chip bonding.

SUMMARY OF THE INVENTION

The invention relates to a technique for achieving low-capacitance bonding pads for high-speed optical semiconductor devices such as lasers, detectors and modulators. The invention is particularly useful in creating low-capacitance bonding pads for vertical cavity surface emitting lasers (VCSELs).

A typical VCSEL structure generally includes an active medium and a current confining region sandwiched between an upper and a lower mirror stack. An upper metal contact is located at the top of the upper mirror stack and normally includes an aperture for the emission of light from the laser. A lower metal contact is typically located below the level of the active medium so that current flow from the upper contact passes through the current confining region and the active medium to the lower metal contact.

In the structure according to the invention, the metal contact area, the associated metal bonding pad and the interconnecting metal bridge are deposited on top of the upper mirror stack which is also conductive. To prevent current flow from the pad through the conductive mirror stack which would bypass the active medium, a moat is etched surrounding the pad area. This moat isolates the pad metal portion and the conductive material beneath the pad metal portion. Since it is electrically isolated by the moat, the layered material beneath the pad metal portion can be electrically conductive, insulating or semiconducting. The moat also undercuts the interconnecting metal bridge which connects the pad area to the contact area.

For the purposes of this application, the term, "semiconductor layers" is defined as including the layered material between or adjacent the metal contact surfaces. In a typical VCSEL, the semiconductor layers would include the active medium, the current confining region and the mirror stacks. In other types of lasers, detectors and modulators, the semiconductor layers between or adjacent the metal contacts could include various combinations of semiconducting, conducting or insulating layers.

In the method according to the invention, the semiconductor layered portion of the optical semiconductor device is first formed on a suitable substrate. These semiconductor layers can include various layers of electrically conductive, semiconductive or insulating material as may be required for the type of device being constructed. The metal contact and the metal bonding pad areas together with an interconnecting metal bridge are then deposited on the surface of the semiconductor layers. The structure is then etched down from the top surface to form a moat surrounding the bonding pad area which electrically isolates the semiconductor layered material beneath the bonding pad and to undercut the material beneath the interconnecting bridge.

An alternative method is to form the semiconductor layers and then etch the areas surrounding the bonding pad from the bottom upwardly toward the metal bonding pad. According to this method the etch need only go high enough to prevent the current flow bypassing the active medium of the optical semiconductor device. In other words, the moat need only go as deep as required to cut off the bypassing current flow. Once the moat has been formed, the structure is completed by securing it to a suitable substrate.

Other aspects and advantages of the invention will become apparent from the following detailed description and accompanying drawing, illustrating by way of example the features of the invention.

DETAILED DESCRIPTION

The invention relates to fabrication of low-capacitance bonding pads for use with high-speed optical semiconductor devices such as lasers, photodetectors, and modulators. During fabrication of the low-capacitance bonding pads, planar metal is used without compromising the performance of the device due to excessive bond pad capacitance.

A vertical cavity surface emitting laser is described as the first embodiment of the invention, although the technique can be used equally well for edge-emitting lasers, photodetectors, and other types of optical semiconductor devices.

Figure 1A:
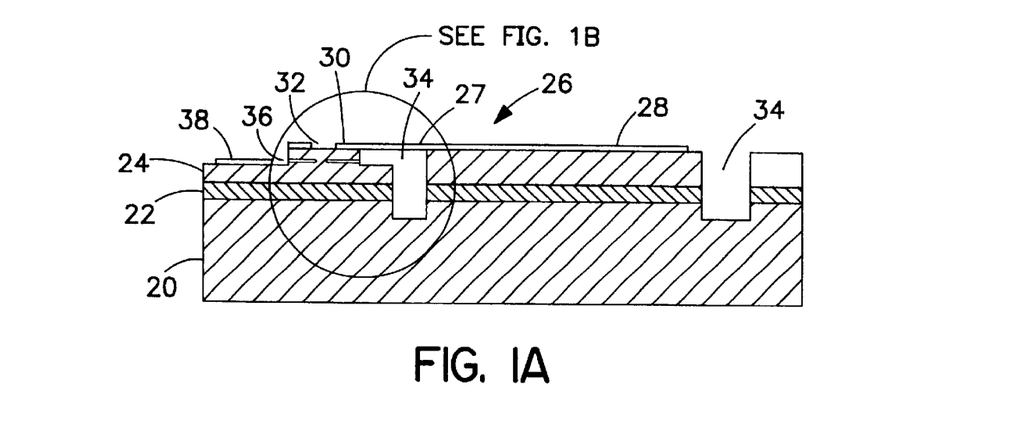
FIG. 1A is a sectional view of an optical semiconductor device with an undercutting moat according to a first embodiment of the invention.

FIG. 1A is a sectional side view illustrating an optical semiconductor device, which includes a VCSEL structure, produced in accordance with the present invention. The optical semiconductor device includes a substrate 20. A semi-insulating layer 22 is disposed on the substrate. Semiconductor layers 24 are disposed above semi-insulating layer 22. The semiconductor layers present a first level and a second level. A first level metal deposit 26 on the first level includes an isolated pad metal portion 28, a contact metal portion 30 and an interconnecting bridge 27. The first level metal deposit defines an aperture 32 through which light can escape from the VCSEL structure in this embodiment of the invention. A moat 34 extends downward through semiconductor layers 24, past semi-insulating layer 22, into substrate 20 and circumscribes the semiconductor layers underneath pad metal portion 28. Substrate 20 can be an electrically conducting or non-conducting material. The air-bridge portion 27 of first level metal 26, which joins contact metal portion 30 and pad metal portion 28, traverses and overlies a part of moat 34. A current confining region 36 is disposed above the second level within semiconductor layers 24. A second level metal deposit 38 on the second level is both the semiconductor/metal interface and the bond metal.

Figure 1B:
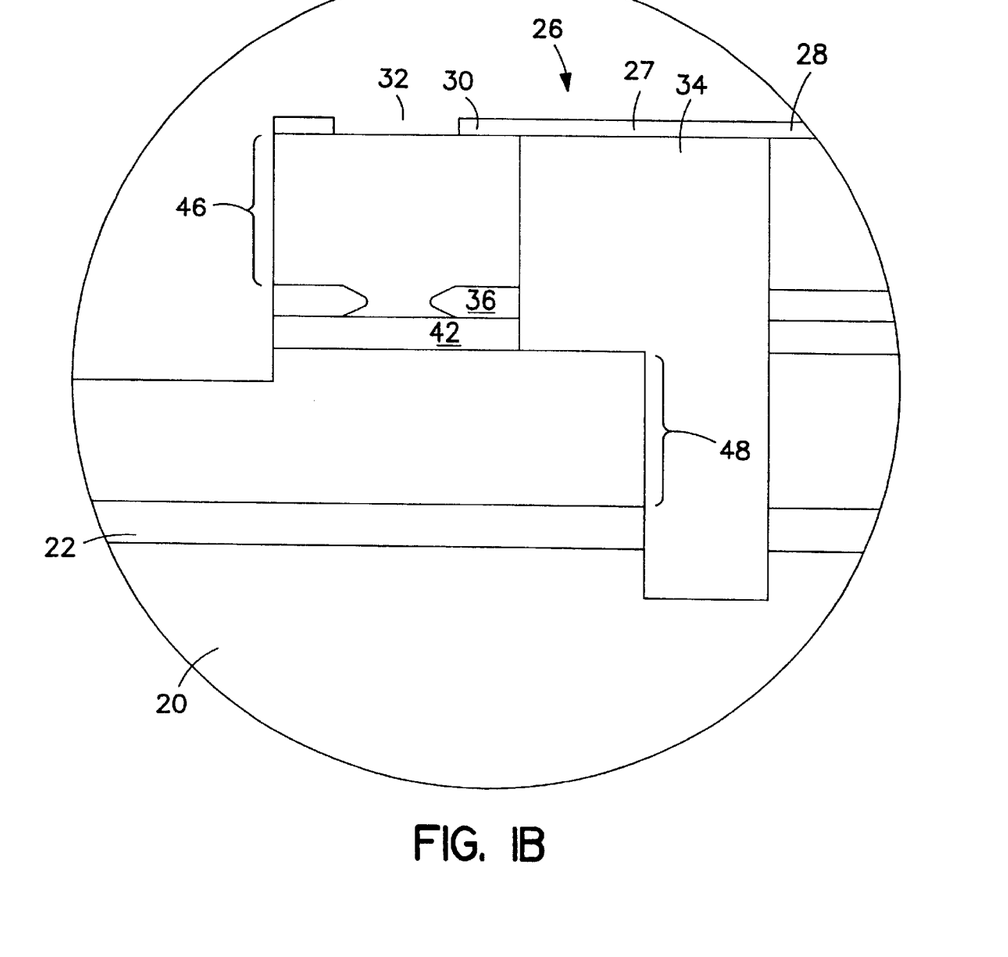
FIG. 1B is an enlarged view of a VCSEL structure in the optical semiconductor device depicted in FIG. 1A.
Figure 2:
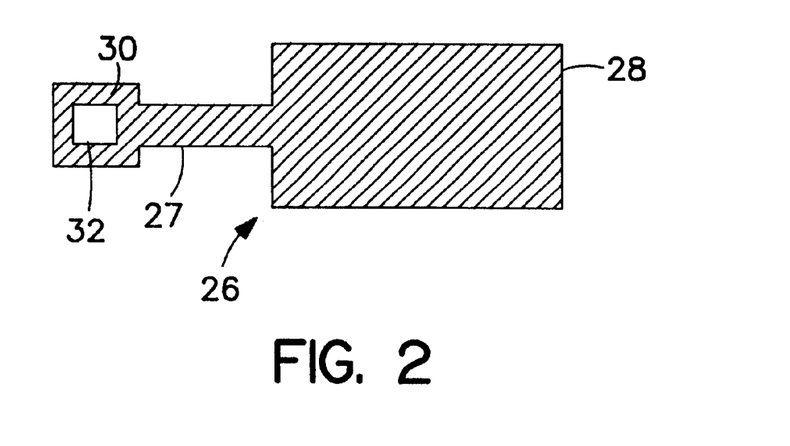
FIGS. 2–5 illustrate a process of making the optical semiconductor device depicted in FIG. 1A.
Figure 3:
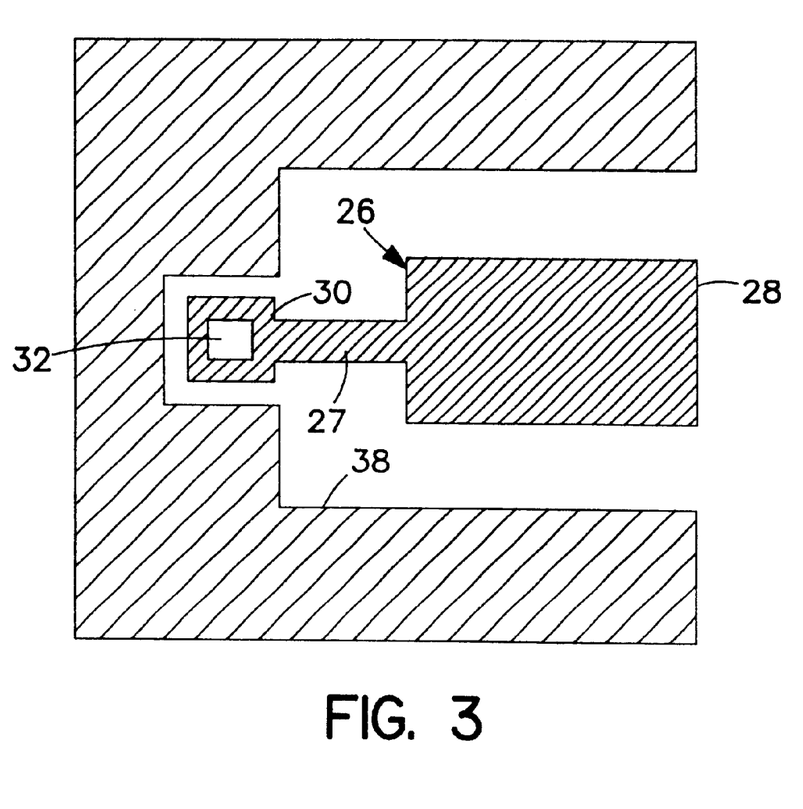

FIG. 1B is an enlarged view of the VCSEL structure shown in FIG. 1A. The VCSEL structure includes an active medium 42 adjacent current confinement region 36. The active medium and the current confinement region are sandwiched between an upper mirror stack 46 and a lower mirror stack 48.

During operation of the VCSEL structure shown in FIG. 1B, current flows in a path from the bond pad portion of the upper contact metal 26 to the lower contact metal 38 (FIG. 1A). The current path includes the bridge portion joining contact portion 30 and bond pad portion 28, conducting upper mirror 46, current confinement region 36, active medium 42, conducting lower mirror stack 48 and lower contact metal 38. The current flow through active medium 42 stimulates the active medium to emit laser light. The laser light is emitted from the VCSEL structure through aperture 32.

FIGS. 2–5 are plan views illustrating the making of the optical semiconductor device shown in FIG. 1A. First level metal 26 is deposited on semiconductor layers 24 (FIG. 1A), in the pattern shown in FIG. 2, including a pad metal portion 28, a contact metal portion 30 and an interconnecting bridge portion 27. First level metal 26 functions as the semiconductor/metal interface and the pad metal for the contact. Semiconductor layers 24 (FIG. 1A) are etched down to the second level. Second level metal contact 38 is deposited on the second level, in the pattern shown in FIG. 3.

Figure 4:
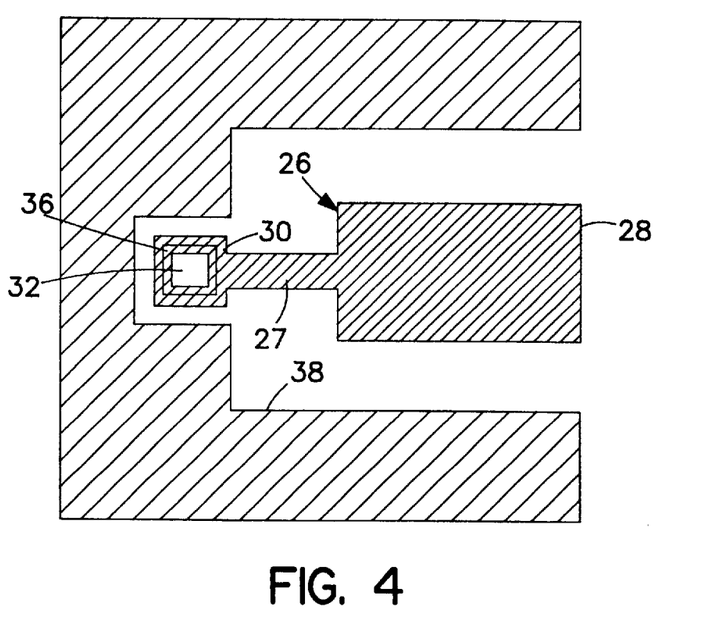

With reference to FIG. 4, current confinement region 36 is created using an etched undercut, wet oxidation, an implant or another technique. The current confinement region constricts current to flow in a current path through active medium 42 (FIG. 1B).

Figure 5:
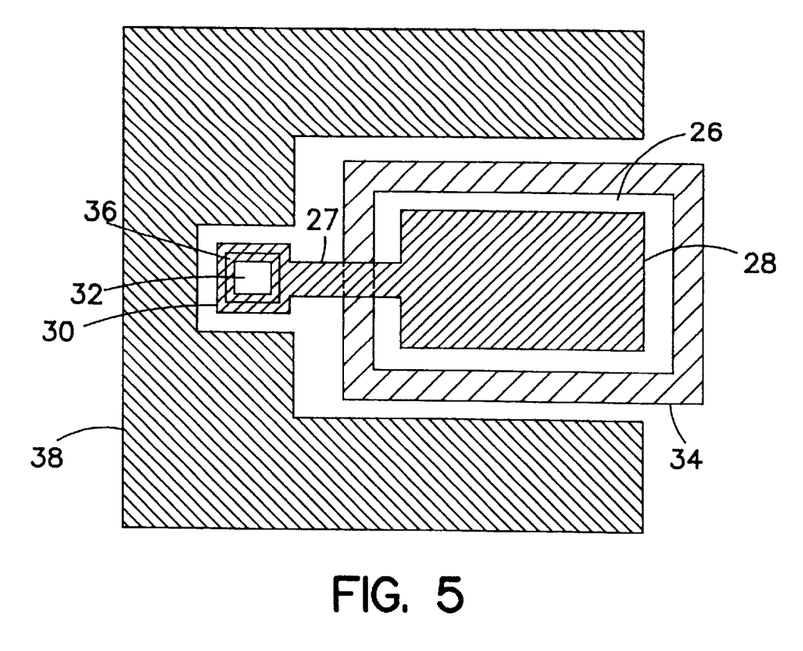

Moat 34 is then etched in a pattern around pad metal portion 28 (FIG. 1) of first level metal 26, as shown in FIG. 5, using wet or dry etching or a combination of wet and dry etching. The etched moat 34 forms an undercut region that extends down below the first level and the second level of semiconductor layers 24 past semi-insulating layer 22, as shown in FIG. 1A. Semi-insulating layer 22 can be grown over a substrate 20 that is electrically conductive or non-conductive, since no electrical contact is made to the substrate.

Moat 34 undercuts the bridge metal portion 27 of first level metal 26 connecting the pad to the metal contact portion, as shown in FIG. 1A. The etched moat 34 electrically isolates the pad area from the rest of the device except for the current path through the undercut bridge metal portion. Even though there are conducting semiconductor layers 24 underneath pad metal portion 28, there is only a small pad capacitance because the etched moat isolates the conducting semiconductor layers 24 beneath pad metal portion 28.

A specific process of making the optical semiconductor device with the undercutting moat illustrated in FIGS. 1A–5 is described in Example 1.

EXAMPLE 1

Photolithography is used to define the p-type first level metal (referred to as "p-metal"). After photolithography, the surface is prepared for metal deposition using dry and wet etching to remove the remnants of the photoresist and the surface oxide on the semiconductor. Then the p-metal is deposited using an e-beam or thermal evaporator, followed by lift-off of the photoresist. A mixture of titanium, platinum and gold is used for the p-metal.

Then a layer of silicon nitride ($Si_3N_4$) is grown over the entire wafer. Photolithography is used to define the nitride. The purpose of the nitride is to protect the aperture of the VCSEL during the dry etch procedure that follows. The nitride is defined by using a plasma etch.

With photoresist and nitride protecting the aperture of the VCSEL, and with p-metal defining the p-contact, the device is plasma etched down into the n-layer, using an RIE (reactive ion etch) system. Then the remaining photoresist is removed.

Photolithography is used to define the n-type second level metal (referred to as "n-metal"). As with the p-metal, following the photolithography, a combination of dry and wet etching is used to remove the remnants of the photoresist and the surface oxide of the semiconductor. Then the n-metal is evaporated, followed by lift-off of the photoresist. A mixture of germanium, gold and nickel is used for the n-metal.

Photolithography is then used to define the moat etch. In this example, the moat etch is performed by using a dry etch with an RIE system, followed by a short wet etch, and then removal of the photoresist.

At this point, the low-capacitance bond pads are complete. To complete the laser, the device is then put in a furnace for lateral oxidation to define a current aperture (the current confinement region) in the device, and then the silicon nitride is removed.

Figure 6A:
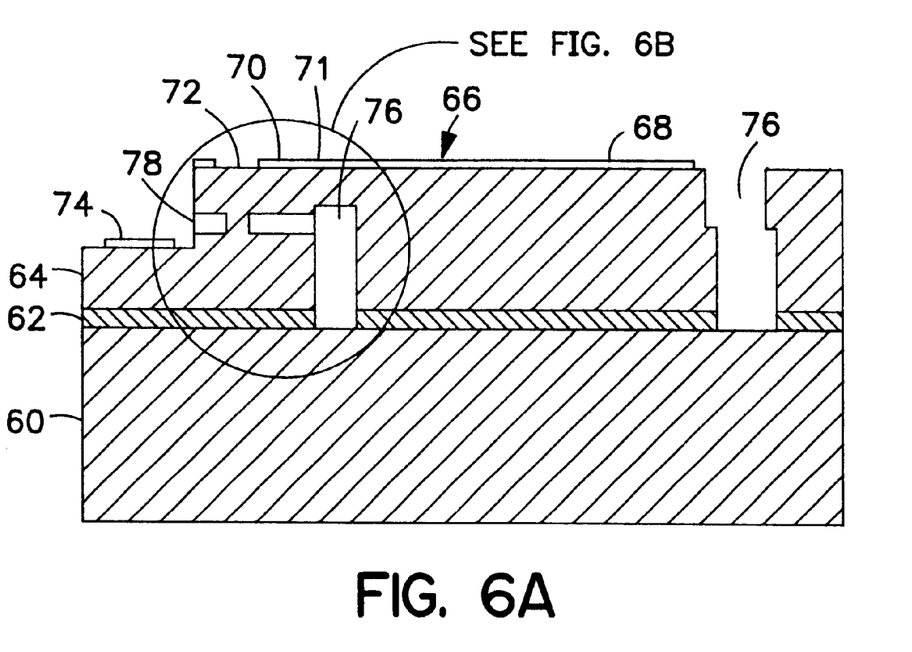
FIG. 6A is a sectional view-of an optical semiconductor device with an embedded moat according to a second embodiment of the invention.

A wafer-bonded VCSEL is described as a second embodiment of the invention. FIG. 6A is a sectional side view illustrating an optical semiconductor device, which includes a VCSEL structure, produced in accordance with the present invention. The optical semiconductor device includes a substrate 60. A non-conducting layer 62 is disposed on the substrate and semiconductor layers 64 are located above the non-conducting layer. Semiconductor layers 64 present a first level and a second level. A first level metal deposit 66 includes a pad metal portion 68, a contact metal portion 70 and a bridge metal portion 71 connecting the pad metal portion to the contact metal portion. Contact metal portion 70 defines an aperture 72 through which light can escape from the VCSEL structure in this embodiment of the invention. A second level metal deposit 74 is disposed on the second level of semiconductor layers 64.

Semiconductor layers 64, non-conducting layer 62 and substrate 60 cooperate to define the moat 76 which circumscribes the pad of the optical semiconductor device. A current confinement region 78, which constricts current to flow in a desired current path through the active medium of the VCSEL structure, is disposed in semiconductor layers 64 and situated above the second level of such semiconductor layers. The current confinement region is created using lateral oxidation, ion implantation, or undercut etching.

Figure 6B:
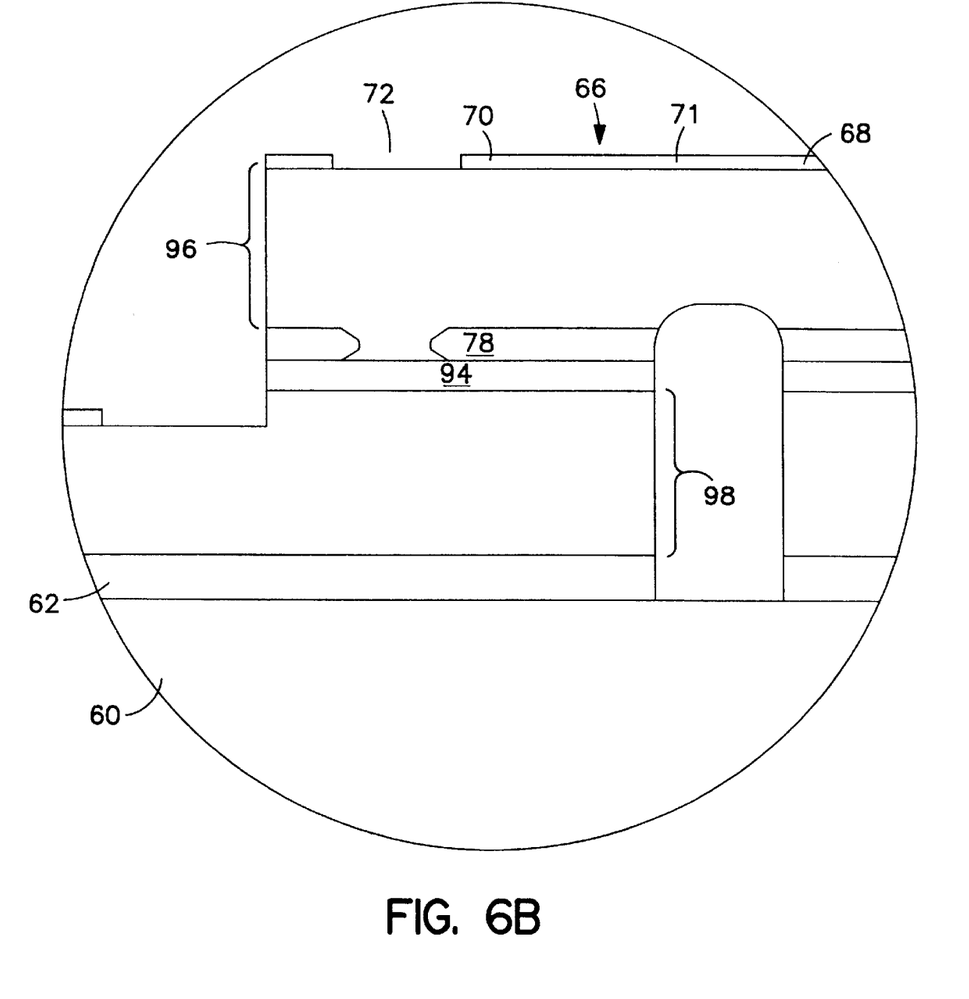
FIG. 6B is an enlarged view of a VCSEL structure in the optical semiconductor device depicted in FIG. 6A.

FIG. 6B is an enlarged view of the VCSEL structure shown in FIG. 6A. An active medium 94 is adjacent current confinement region 78. The active medium and the current confinement region are sandwiched between an upper mirror stack 96 and a lower mirror stack 98. During operation of the VCSEL structure shown in FIG. 6A, current flows in a path from the pad metal portion of the upper contact to the lower contact. The current path includes pad metal portion 68, conducting upper mirror stack 96, current confinement region 78, active medium 94, conducting lower mirror stack 98 and second level metal 74. The current flow through active medium 94 stimulates the active medium to emit laser light. The laser light is emitted from the VCSEL structure through aperture 72.

Figure 7:
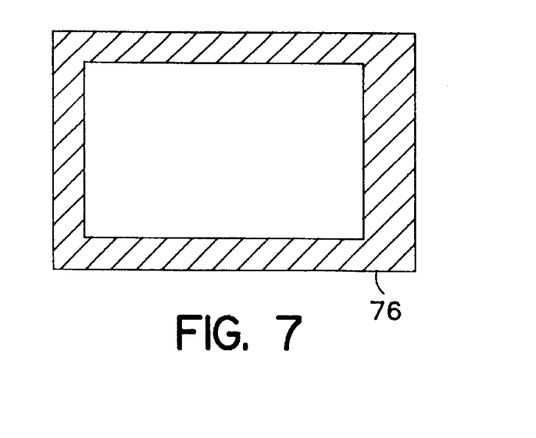
FIGS. 7–11 illustrate a process of making the optical semiconductor device depicted in FIG. 6A.
Figure 8:
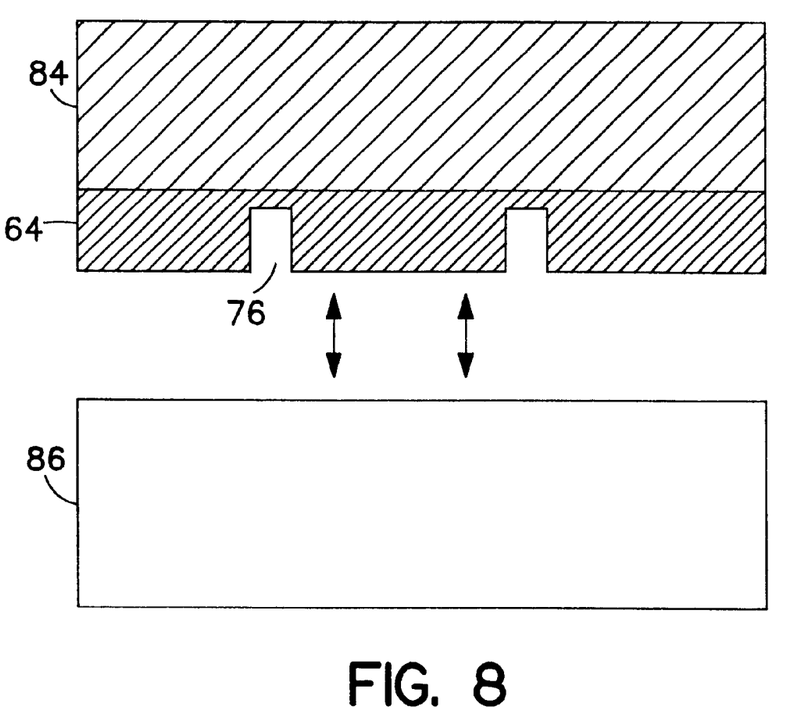
Figure 9:
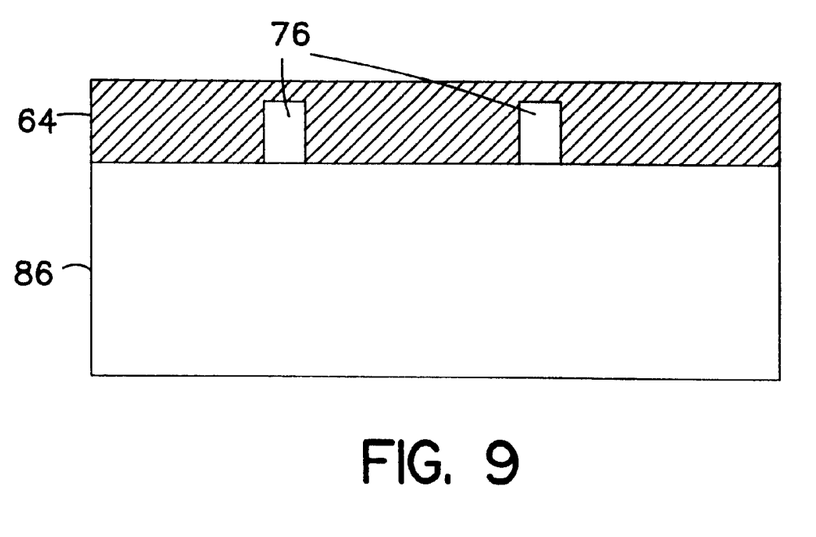

FIGS. 7–11 are plan views illustrating the making of the optical semiconductor device illustrated in FIG. 6A. Moat 76 is etched into the bottom side of a plurality of semiconductor layers 64 which are epitaxially grown on a substrate wafer 84 as shown in FIGS. 7 and 8. The moat etch goes past the layers that make current confining region 78, as shown in FIG. 6A. A host wafer 86 and epitaxial conductive material 64 are then bonded together, as illustrated in FIG. 8. The non-epitaxial substrate wafer 84 is removed from the epitaxial conductive material 64, as shown in FIG. 9, thereby creating an embedded moat 76.

Figure 10:
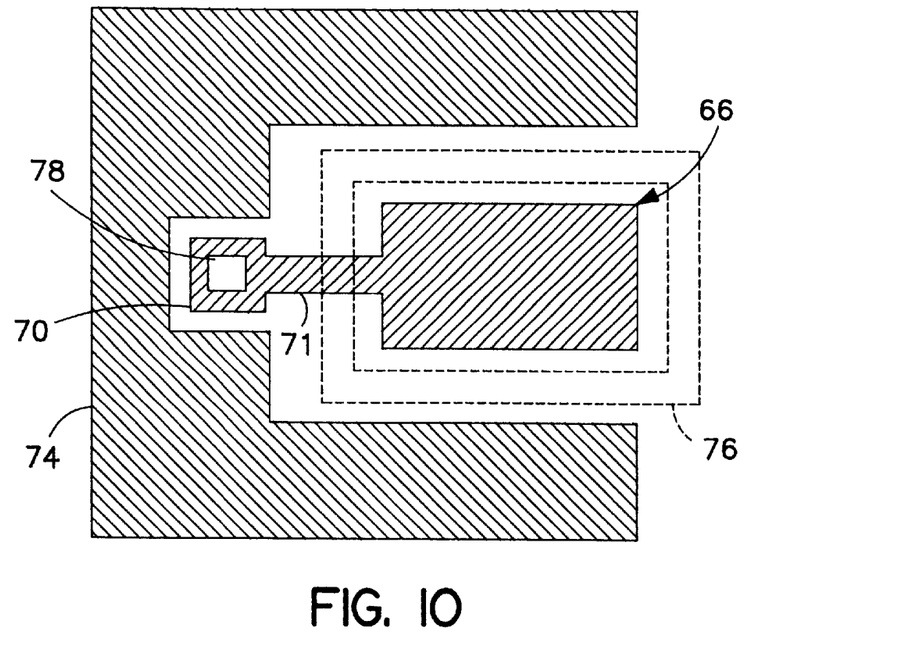
Figure 11:
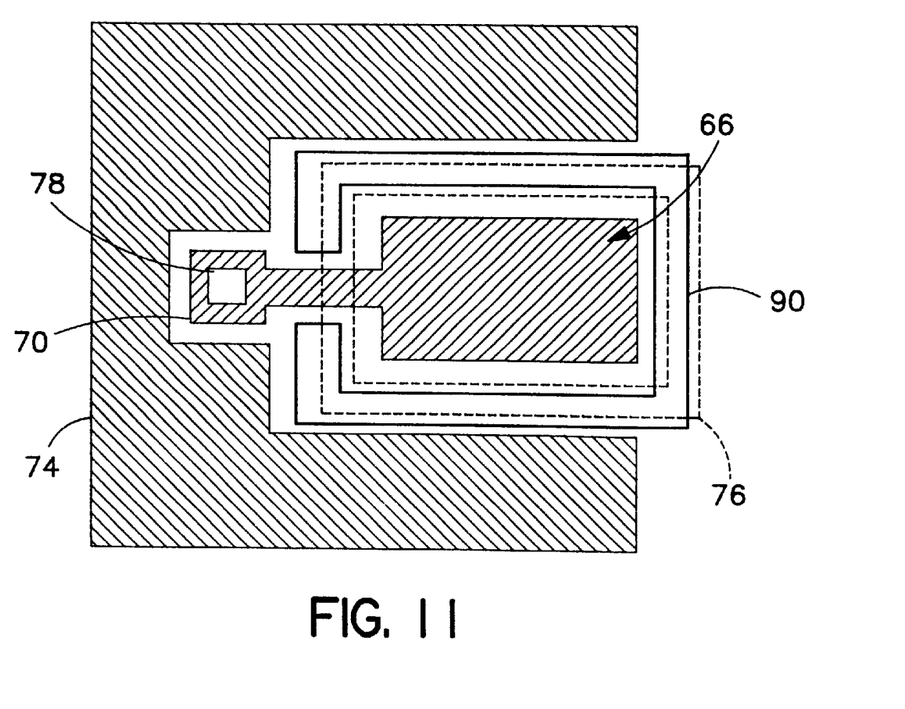

Device processing, such as metalization and current constriction, are performed, as illustrated in FIGS. 10 and 11. First level metal 66 is deposited on the other side of semiconductor layers 64 (i.e., the top side) than the side that was etched to make moat 76. First level metal 66 functions as both the semiconductor/metal interface and the pad metal for the contact. The other side of the plurality of semiconductor layers 64 (i.e., the top side) is then etched down to the second level where second level metal 74 is deposited in the pattern shown in FIG. 10. Second level metal 74 functions as both the semiconductor/metal interface and the bond metal.

With reference to FIG. 11, a matching etch 90 into the top side of semiconductor layers 64, which is aligned with respect to embedded etch 76, completes the low-capacitance bond pad. No undercut etch is required in the second embodiment because there is already an undercut from the embedded moat 76.

A specific process for making the optical semiconductor device with the embedded moat illustrated in FIGS. 6A–11 is described in Example 2.

EXAMPLE 2

To make the optical semiconductor device with the embedded moat, begin with an inverted 850 nm laser grown epitaxially on a GaAs substrate. This epitaxial growth should include an AlAs stop etch layer under the inverted VCSEL to allow for the substrate removal process which will eventually be needed. In this example, the 850 nm wafer-bonded VCSEL will eventually use an oxide aperture for optical and current confinement. This oxide aperture is defined by selective oxidation of an AlAs layer adjacent to the active medium of the device.

Once the stop etch and the inverted VCSEL have been grown on the GaAs substrate, one can begin the steps necessary to process the device into a completed laser with a low-capacitance bond pad.

The first step is to photolithographically define a grid of wafer bonding trenches on the surface of the inverted VCSEL. Once the trenches are defined a quick etch can be performed to transfer the pattern to the surface of the inverted VCSEL.

Next a moat can be photolithographically aligned to the trenches to define where the final bond pads will reside once the processing of the wafer is completed. The moat can then be reactive ion etched with chlorine through to the AlAs layer which will later be selectively oxidized to define an oxidation aperture for the wafer bonded VCSEL. The etch should proceed past the AlAs oxide aperture layer and it should terminate prior to reaching the AlAs stop etch layer.

After etching the moat, the inverted VCSEL is wafer bonded epitaxy side down to a semi-insulating GaAs wafer. The inverted VCSEL's substrate is then removed by a chemical etch which stops on the AlAs stop etch layer. Next the stop etch is removed with a chemical etch, revealing the top surface of the VCSEL which was originally grown inverted. By bonding the inverted VCSEL, a non-inverted VCSEL is realized.

Then processing of the VCSEL can be done. First, infra-red photolithography is used to align the mask for the first level metal to the now buried moat. The first level metal can then be evaporated and the photoresist can be used to lift-off the excess metal, leaving the defined first level metal on the surface of the wafer.

Second, the pattern for the second level metal is defined and a wet chemical etch is used to access the second level metal contacting layers of the VCSEL. After the wet etch, the wafer can be loaded for second level metal evaporation, and the excess metal can once again be lifted off by dissolving the photoresist. The area of the wet chemical etch not only defines the second metal location, but also the mesa of the VCSEL. With both metals evaporated, the metals can now be alloyed in a rapid thermal annealing system.

The metalized wafer can be coated with silicon nitride ($Si_3N_4$) and patterned for the top moat etch. Once patterned, the $Si_3N_4$ is etched from the moat area and the top moat can be etched with a chlorine reactive ion etch until it intersects the embedded moat. After the etch, the photoresist is stripped off and the part can be oxidized to form an oxide aperture for current and optical confinement. The $Si_3N_4$ can then be stripped off leaving a completed VCSEL structure.

While several particular forms of the invention have been illustrated and described, it will also be apparent that various modifications can be made without departing from the spirit and scope of the invention.

What is claimed is:

1. An optical semiconductor device, comprising:
   a semiconducting material disposed above a layer of semi-insulating material;
   wherein said semiconducting material varies in thickness and presents a surface at a first level and a surface at a second level;
   a first level metal disposed on at least a portion of said first level surface;
   wherein said first level metal includes a pad metal portion, a bridge portion, and a contact metal portion;
   a moat that extends through said semiconducting material and into said layer of semi-insulating material;
   wherein said moat surrounds said pad metal portion;
   wherein said bridge portion of said first level metal overlies said moat;

a current confinement region disposed within said semiconducting material and above said second level surface; and a second level metal disposed on at least a portion of said second level surface.

2. The device of claim 1, wherein:

said current confinement region includes an oxide aperture.

3. An optical semiconductor device, comprising:

a semiconducting material disposed above a layer of non-conducting material;

wherein said semiconducting material varies in thickness and presents a first level surface and a second level surface;

a first level metal disposed on said first level surface, wherein said first level metal includes a pad metal portion and a contact metal portion;

a second level metal on said second level surface;

a moat that surrounds said pad metal portion, wherein part of said first level metal overlies said moat; and a current confinement region disposed within said semiconducting material above said second level surface.

4. An optical semiconductor device comprising:

a layered semiconductor material presenting a first level and a second level;

a first level metal on said first level including a contact portion, a bond pad portion, and a bridge portion joining said contact portion and said bond pad portion; and a moat that electrically isolates the layered semiconductor material beneath said bond pad portion from a second level metal on said second level, wherein said layered semiconductor material beneath said bond pad portion is an electrical conductor.

5. The optical semiconductor device of claim 4, wherein said layered semiconductor material beneath said bond pad portion is disposed above a layer of semi-insulating material.

6. The optical semiconductor device of claim 4, wherein said moat undercuts said bridge portion.

7. The optical semiconductor device of claim 4, wherein said layered semiconductor material beneath said bond pad portion is disposed above a layer of non-conducting material.

* * * * *